(12) United States Patent
Hu et al.

(10) Patent No.: US 9,401,410 B2
(45) Date of Patent: Jul. 26, 2016

(54) POLY SANDWICH FOR DEEP TRENCH FILL

(71) Applicant: Texas Instruments Incorporated, Dallas, TX (US)

(72) Inventors: Binghua Hu, Plano, TX (US); Sameer P Pendharkar, Allen, TX (US); Jarvis Benjamin Jacobs, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/555,300

(22) Filed: Nov. 26, 2014

(65) Prior Publication Data

US 2016/0149011 A1    May 26, 2016

(51) Int. Cl.
| | |
|---|---|
| H01L 21/8242 | (2006.01) |
| H01L 29/45 | (2006.01) |
| H01L 49/02 | (2006.01) |
| H01L 29/41 | (2006.01) |
| H01L 21/02 | (2006.01) |
| H01L 21/265 | (2006.01) |
| H01L 21/3215 | (2006.01) |
| H01L 21/324 | (2006.01) |
| H01L 21/225 | (2006.01) |

(52) U.S. Cl.
    CPC .......... *H01L 29/45* (2013.01); *H01L 21/02164* (2013.01); *H01L 21/02255* (2013.01); *H01L 21/02532* (2013.01); *H01L 21/02595* (2013.01); *H01L 21/2253* (2013.01); *H01L 21/26513* (2013.01); *H01L 21/324* (2013.01); *H01L 21/32155* (2013.01); *H01L 28/20* (2013.01); *H01L 28/40* (2013.01); *H01L 29/41* (2013.01)

(58) Field of Classification Search
    CPC .............. H01L 29/66181; H01L 29/4236; H01L 29/66712; H01L 29/7802; H01L 29/0878; H01L 29/7813; H01L 29/7827; H01L 29/7834; H01L 29/945; H01L 29/45; H01L 29/41; H01L 27/10861; H01L 27/10829; H01L 21/02255; H01L 21/26513; H01L 21/02164; H01L 21/02595; H01L 21/32155; H01L 21/02532; H01L 21/324; H01L 21/2253; H01L 28/20; H01L 28/40; B81C 1/00666; B81C 2201/0167; C23C 16/045; C23C 16/24
    USPC ........... 257/E21.651, 301, E27.092, E21.135, 257/E21.151, E29.155, 330, 332, 380, 516, 257/538, 586, 621, 655; 438/386, 243, 392, 438/249, 270, 430, 554, 248, 389, 561, 564
    See application file for complete search history.

(56) References Cited

U.S. PATENT DOCUMENTS

| | | | |
|---|---|---|---|
| 4,666,556 A | 5/1987 | Fulton et al. | |
| 4,980,747 A | 12/1990 | Hutter et al. | |
| 5,913,125 A * | 6/1999 | Brouillette | .......... B81C 1/00666 257/E21.133 |

(Continued)

*Primary Examiner* — Chuong A Luu
*Assistant Examiner* — Cory Eskridge
(74) *Attorney, Agent, or Firm* — Jacqueline J. Garner; Frank D. Cimino

(57) ABSTRACT

A semiconductor device is formed by forming a deep trench in a substrate and a dielectric liner on sidewalls of the deep trench. A first undoped polysilicon layer is formed on the semiconductor device, extending into the deep trench on the dielectric liner, but not filling the deep trench. Dopants are implanted into the first polysilicon layer. A second layer of polysilicon is formed on the first layer of polysilicon. A thermal drive anneal activates and diffuses the dopants. In one version, the dielectric liner is removed at the bottom of the deep trench before the first polysilicon layer is formed, so that the polysilicon in the deep trench provides a contact to the substrate. In another version, the polysilicon in the deep trench is isolated from the substrate by the dielectric liner.

13 Claims, 15 Drawing Sheets

(56) References Cited

U.S. PATENT DOCUMENTS

| | | |
|---|---|---|
| 6,218,722 B1 | 4/2001 | Cervin-Lawry et al. |
| 2004/0032005 A1 | 2/2004 | Williams et al. |
| 2007/0254430 A1* | 11/2007 | Cheng .................... A01N 25/08 438/243 |
| 2011/0275168 A1 | 11/2011 | Davis et al. |
| 2014/0001596 A1 | 1/2014 | Hu et al. |

* cited by examiner

POLY SANDWICH FOR DEEP TRENCH FILL

FIELD OF THE INVENTION

This invention relates to the field of semiconductor devices. More particularly, this invention relates to deep trench structures in semiconductor devices.

BACKGROUND OF THE INVENTION

A semiconductor device has a deep trench structure with a dielectric liner on sidewalls of the deep trench and doped polycrystalline silicon (polysilicon) on the dielectric liner filling the deep trench. Attaining a desirably low sheet resistance in the polysilicon in the deep trench requires in situ doping as the polysilicon is deposited, which undesirably causes dopant contamination on the backside of the substrate of the semiconductor device and stress in the semiconductor device after the deposited polysilicon is annealed. Both undesirable effects can degrade performance and reliability of the semiconductor device. Alternatively, undoped polysilicon may be deposited and implanted at the top surface of the semiconductor device, requiring a long thermal drive to attain a desired uniformity of dopant distribution in the deep trench, which may be over 20 microns deep. The long thermal drive adversely affects doped structures in the substrate, such as buried layers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device is formed by forming a deep trench in a substrate of the semiconductor device. A dielectric liner is formed on sidewalls of the deep trench. A first undoped polysilicon layer is formed on the semiconductor device, extending into the deep trench on the dielectric liner, but not filling the deep trench. Dopants are implanted into the first polysilicon layer. A second layer of polysilicon is formed on the first layer of polysilicon. A thermal drive anneal activates and diffuses the dopants. Polysilicon of the first layer of polysilicon and second layer of polysilicon is removed from over a top surface of the substrate.

DETAILED DESCRIPTION OF EXAMPLE EMBODIMENTS

Figure 1:
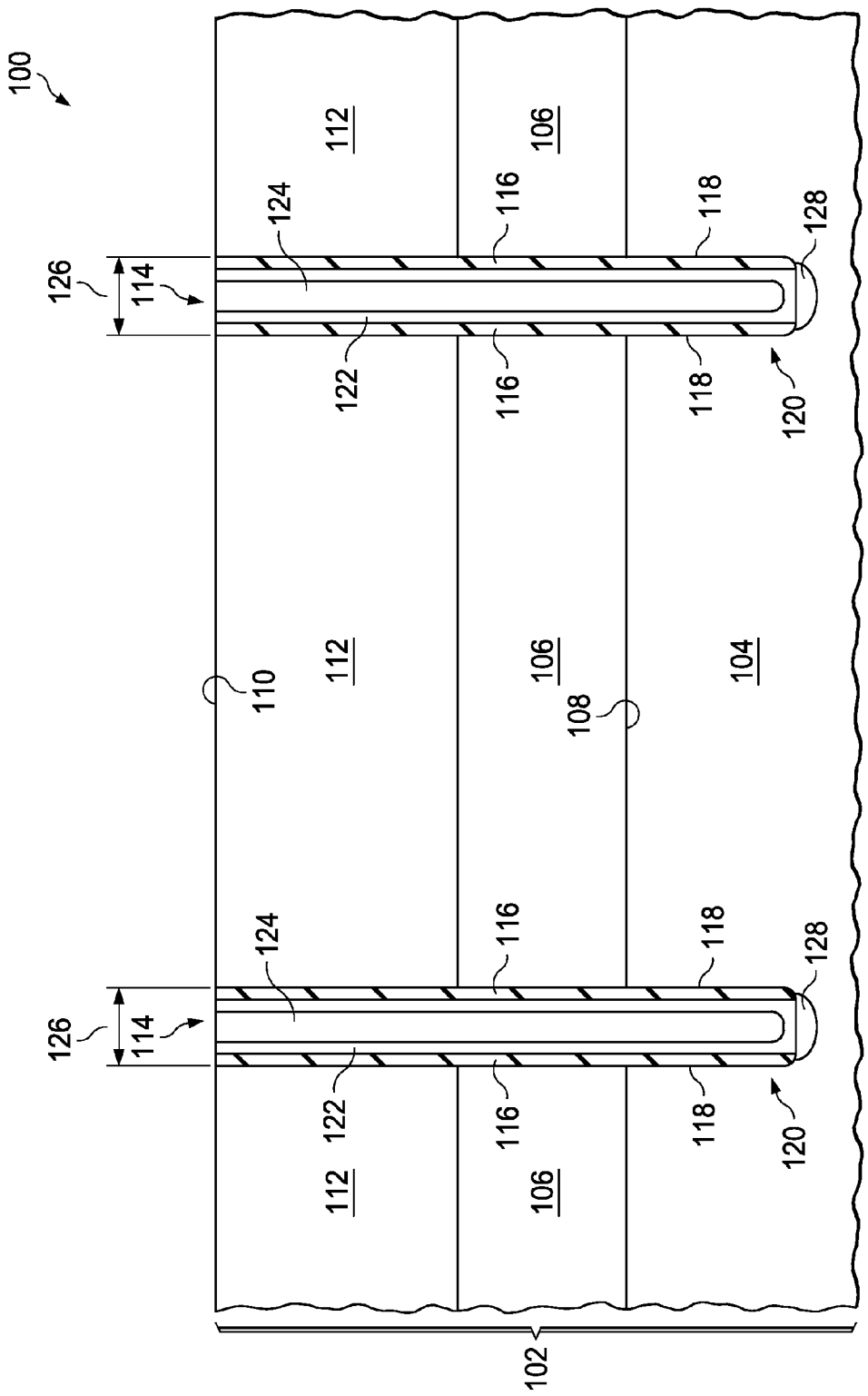
FIG. 1 is a cross section of an example semiconductor device.

The following co-pending patent applications are related and hereby incorporated by reference: U.S. patent application Ser. No. 14/555,209, U.S. patent application Ser. No. 14/555,330, and U.S. patent application Ser. No. 14/555,359, all filed simultaneously with this application).

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device is formed by forming a deep trench at least 10 microns deep in a substrate of the semiconductor device. A dielectric liner is formed on sidewalls of the deep trench. A first undoped polysilicon layer is formed on the semiconductor device, extending into the deep trench on the dielectric liner, but not filling the deep trench. Dopants are implanted into the first polysilicon layer. A second undoped layer of polysilicon is formed on the first layer of polysilicon. A thermal drive anneal activates the dopants and diffuses them throughout the first and second polysilicon layers. Polysilicon of the first layer of polysilicon and second layer of polysilicon is removed from over a top surface of the substrate. In one example, dielectric material of the dielectric liner may be removed at a bottom of the deep trench so as to expose the substrate. The first layer of polysilicon then makes an electrical connection to the substrate at the bottom of the deep trench, for example to a region under a buried layer. In another example, the first layer of polysilicon is electrically isolated from the substrate at the bottom of the deep trench by the dielectric liner. The isolated polysilicon in the deep trench may provide a resistor or capacitor of the semiconductor device.

For the purposes of this disclosure, the term undoped as applied to forming a layer of polysilicon on a semiconductor device is understood to mean that at most an insignificant amount of dopants are includes in reactant gases used to form the polysilicon layer. It is understood that some dopants already present in the semiconductor device may diffuse into the polysilicon layer as the polysilicon layer is formed, but this does not negate the undoped nature of the formation of the polysilicon layer.

FIG. 1 is a cross section of an example semiconductor device. The semiconductor device 100 is formed in a substrate 102 comprising semiconductor material 104, for example, p-type silicon. A buried layer 106, for example an n-type buried layer 106, may be disposed in the substrate 102 so that a bottom surface 108 of the buried layer 106 is more than 10 microns below a top surface 110 of the substrate 102. The substrate 102 may include an upper layer 112 over the buried layer 106, for example a p-type epitaxial layer 112. In the instant example, the semiconductor material 104 below the buried layer 106 may possibly be electrically isolated from the upper layer 112 by the buried layer 106.

The semiconductor device 100 includes one or more deep trench structures 114 which extend at least 10 microns deep in the substrate 102. Each deep trench structure 114 includes a dielectric liner 116 on sidewalls 118 of a deep trench 120 of the deep trench structure 114. A first layer of polysilicon 122 is disposed on the dielectric liner 116, extending to a bottom of the deep trench structure 114. A second layer of polysilicon 124 is disposed on the first layer of polysilicon 122, and extends into the deep trench 120. Dopants are distributed in the first layer of polysilicon 122 and the second layer of polysilicon 124 with an average doping density of at least $1 \times 10^{18}$ cm$^{-3}$. A width 126 of the deep trench structure 114 is 1.5 microns to 3.5 microns.

In the instant example, dielectric material of the dielectric liners 116 is removed at bottoms of the deep trench structures 114 and contact regions 128 are disposed in the substrate 102 at the bottoms of the deep trench structures 114 so that the first layer of polysilicon 122 makes electrical connections to the substrate 102 through the contact regions 128. The contact regions 128 may have an average doping density of at least $5 \times 10^{18}$ cm$^{-3}$. The deep trench structures 114 thus provides electrical connections from the top surface 110 of the substrate 102 to the semiconductor material 104 below the buried layer 106 with an advantageously low resistance due to the average doping density of at least $5 \times 10^{18}$ cm$^{-3}$. The deep trench structures 114 may have a closed-loop configuration so as to surround and thus isolate a portion of the upper layer 112 and a component of the semiconductor device 100 in the upper layer 112 portion.

Figure 2A:
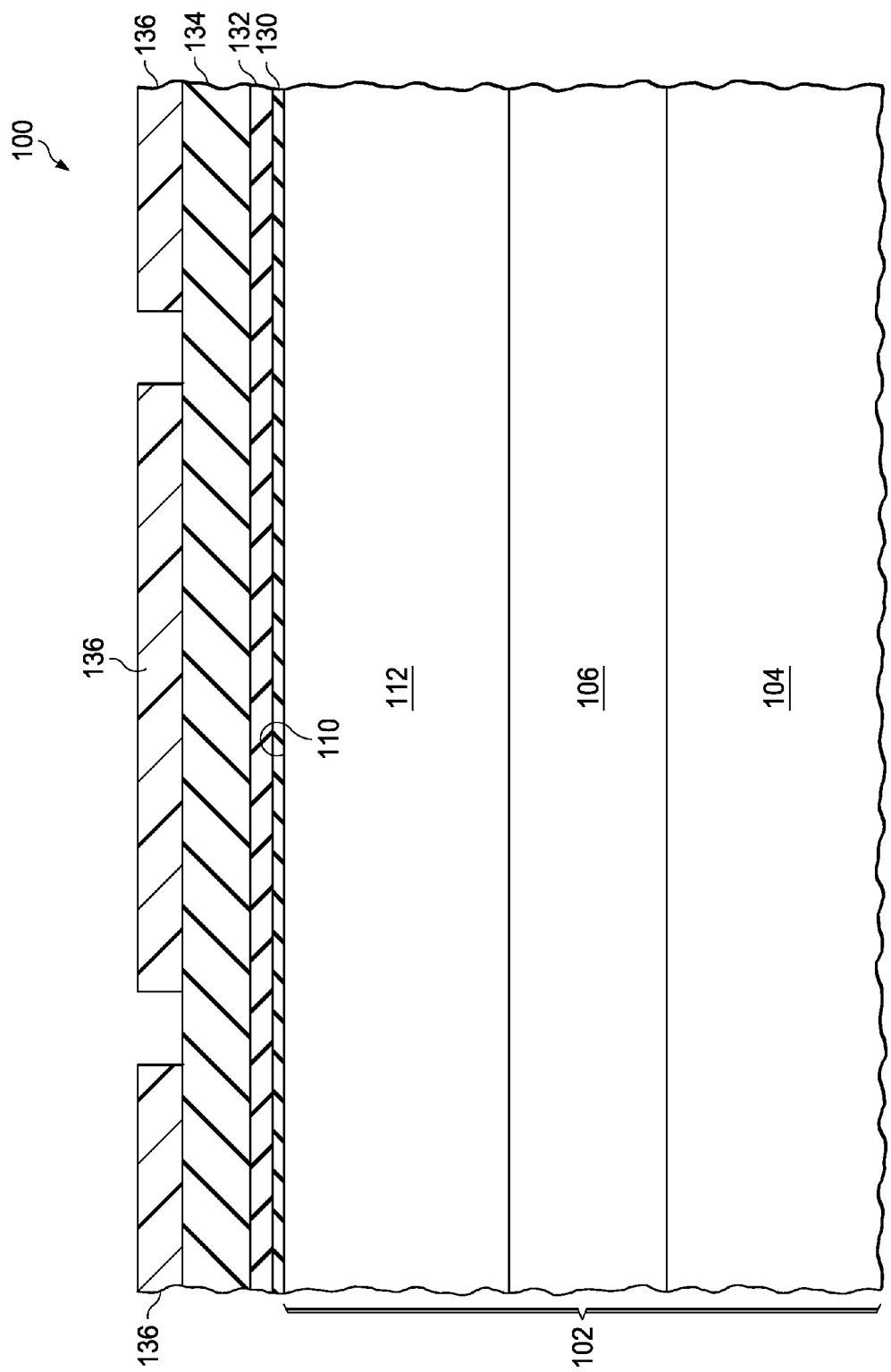
FIG. 2A through FIG. 2J are cross sections of the semiconductor device of FIG. 1, depicted in successive stages of fabrication.

FIG. 2A through FIG. 2J are cross sections of the semiconductor device of FIG. 1, depicted in successive stages of fabrication. Referring to FIG. 2A, the buried layer 106 and the upper layer 112 are formed on the semiconductor material 104. The buried layer 106 and the upper layer 112 may be formed by implanting n-type dopants into the p-type semiconductor material 104, followed by a thermal drive anneal and a subsequent epitaxial process to grow the p-type upper layer 112, so that the buried layer 106 is formed by diffusion and activation of the implanted n-type dopants.

A layer of pad oxide 130 is formed at the top surface 110 of the substrate, for example by thermal oxidation. The layer of pad oxide 130 may include 5 nanometers to 30 nanometers of silicon dioxide. A layer of pad nitride 132 is formed on the layer of pad oxide 130, for example by low pressure chemical vapor deposition (LPCVD) using ammonia and silane. The layer of pad nitride 132 may include 100 nanometers to 300 nanometers of silicon nitride. A layer of hard mask oxide 134 is formed over the layer of pad nitride 132, for example by a plasma enhanced chemical vapor deposition (PECVD) using tetraethyl orthosilicate, also called tetraethoxysilane (TEOS), or using a high density plasma (HDP) process. The layer of hard mask oxide 134 may include 500 nanometers to 2 microns of silicon dioxide. The layer of pad nitride 132 provides an etch stop layer for subsequent etching of the layer of hard mask oxide 134.

A trench mask 136 is formed over the layer of hard mask oxide 134 so as to expose areas for the deep trench structures 114 of FIG. 1. The trench mask 136 may include photoresist formed by a photolithographic process, and may further include a hard mask layer and/or an anti-reflection layer.

Figure 2B:
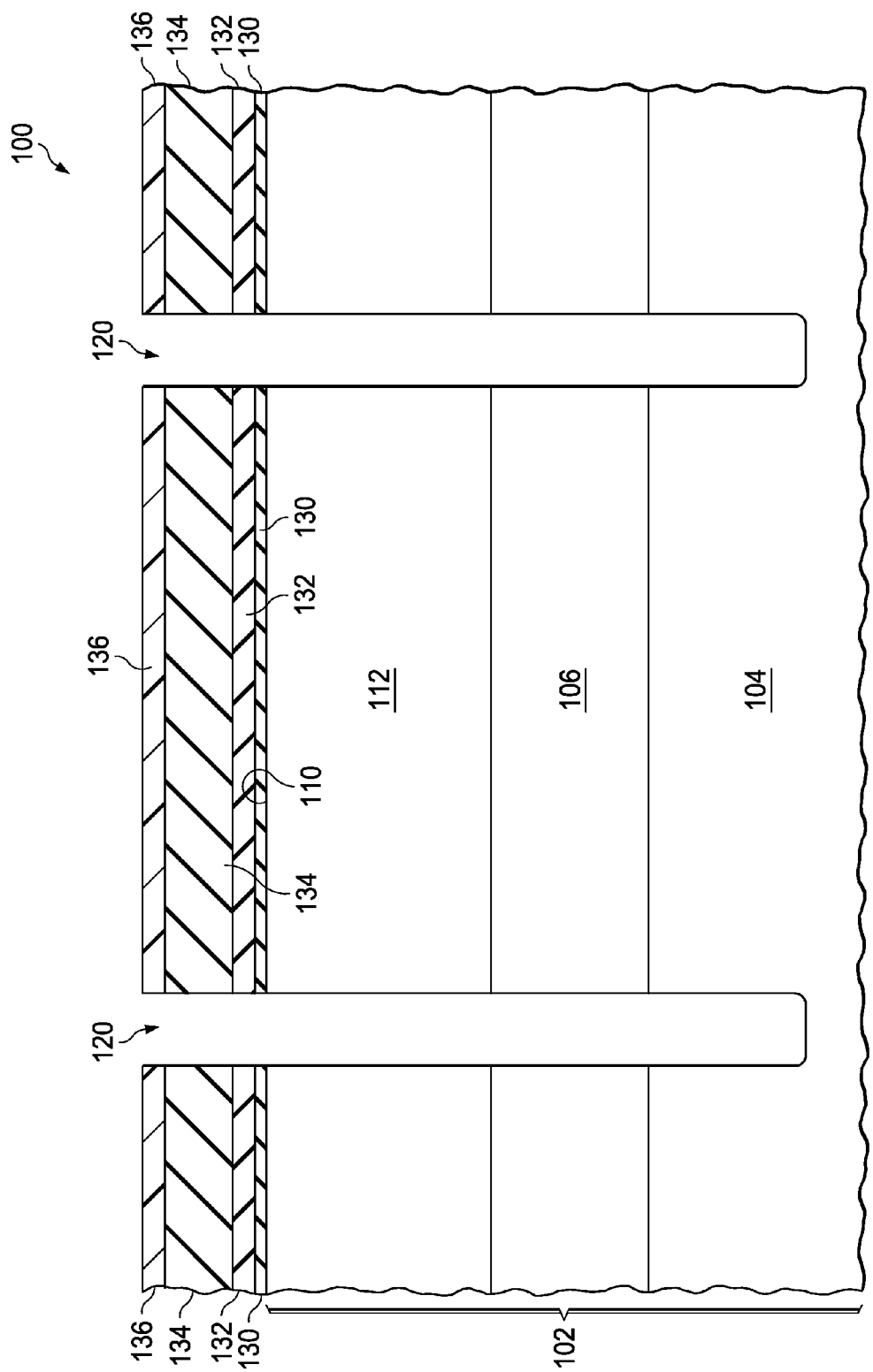

Referring to FIG. 2B, a hard mask etch process removes material from the layer of hard mask oxide 134 in the areas exposed by the trench mask 136. Subsequently, a stop layer etch process removes the layer of pad nitride 132 and the layer of pad oxide 130 in the areas exposed by the trench mask 136.

A trench etch process removes material from the substrate 102 in the areas exposed by the trench mask 136 to form the deep trenches 120 which extend to below the bottom surface of the buried layer 106. The deep trenches 120 may be, for example, 12 microns to 35 microns deep. A significant portion, as depicted in FIG. 2B, and possibly all of the trench mask 136, and possibly a portion of the layer of hard mask oxide 134, may be eroded by the trench etch process. Any remaining trench mask 136 is removed after the deep trenches 120 are formed.

Figure 2C:
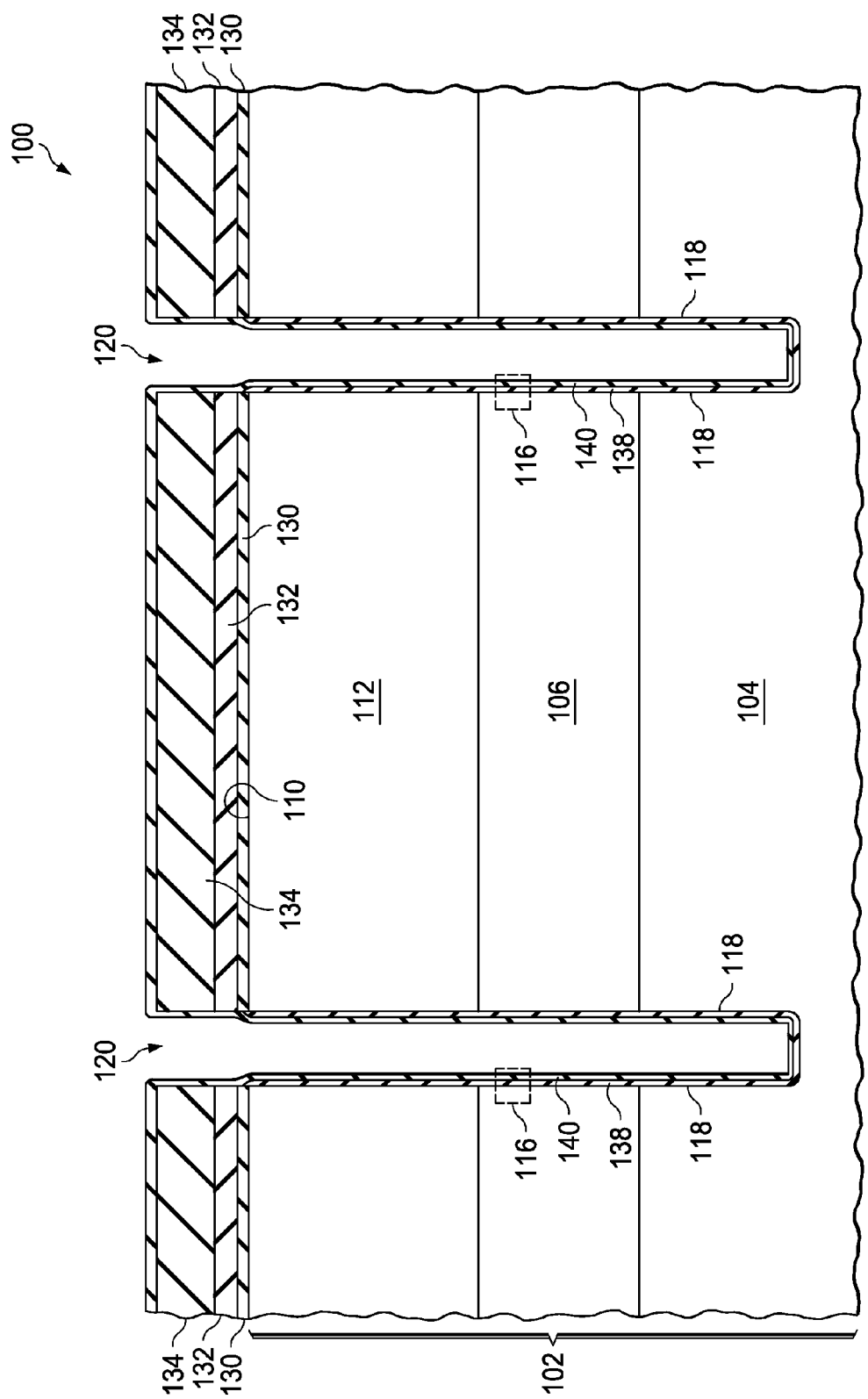

Referring to FIG. 2C, a layer of thermal oxide 138 is formed on the sidewalls 118 and bottoms of the deep trenches 120. The layer of thermal oxide 138 may be, for example, 50 nanometers to 400 nanometers thick. A layer of silicon dioxide 140 is formed on the layer of thermal oxide 138, for example by a sub-atmospheric chemical vapor deposition (SACVD) process. The layer of silicon dioxide 140 may be, for example, 50 nanometers to 500 nanometers thick. The layer of thermal oxide 138 combined with the layer of silicon dioxide 140 provide the dielectric liner 116.

Figure 2D:
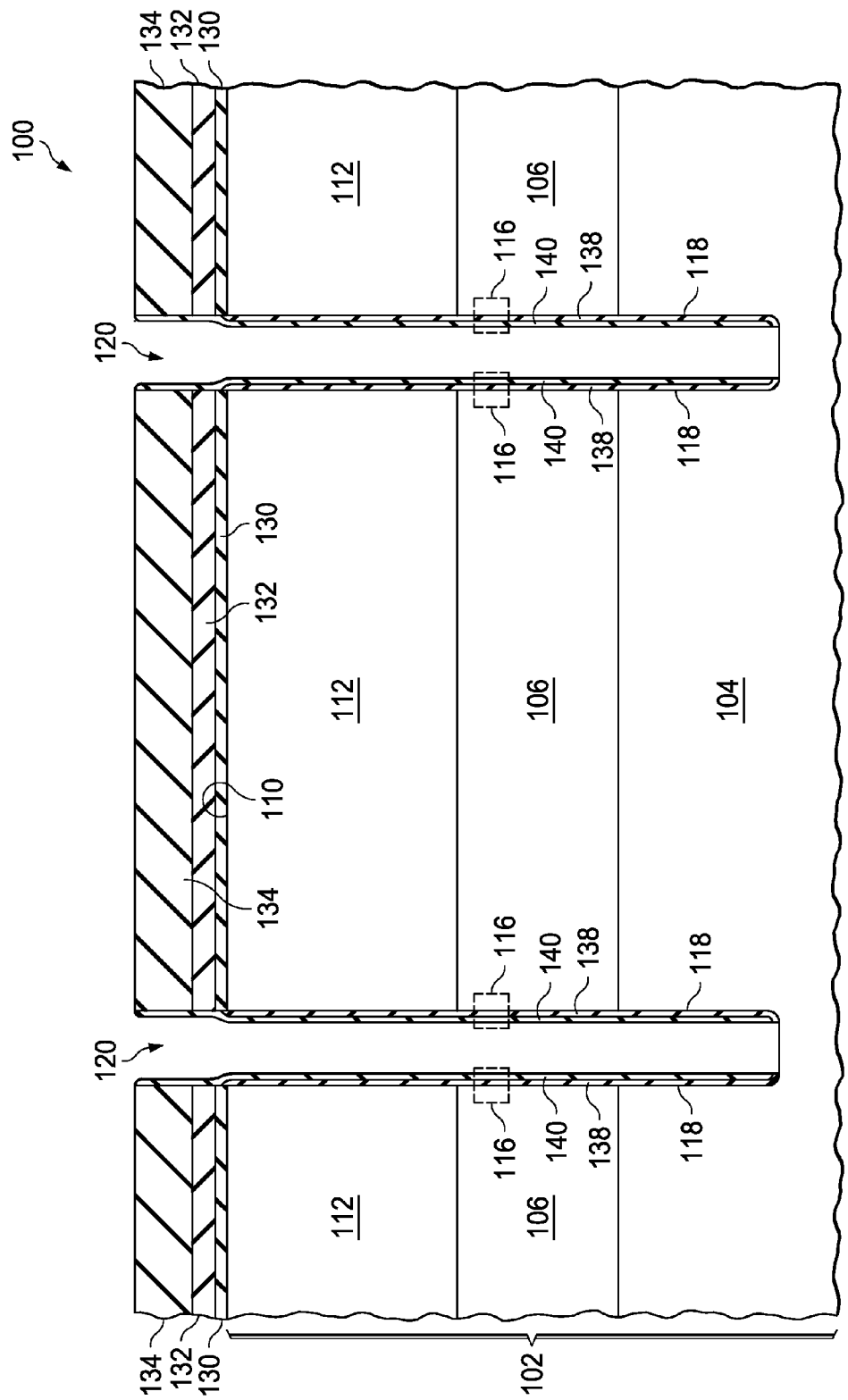

Referring to FIG. 2D, the dielectric liner 116 is removed at bottoms of the deep trenches 120 so as to expose the semiconductor material 104. The dielectric material may be removed, for example, by a reactive ion etch (RIE) process using fluorine radicals, which leaves the dielectric liner 116 on the sidewalls 118 substantially intact.

Figure 2E:
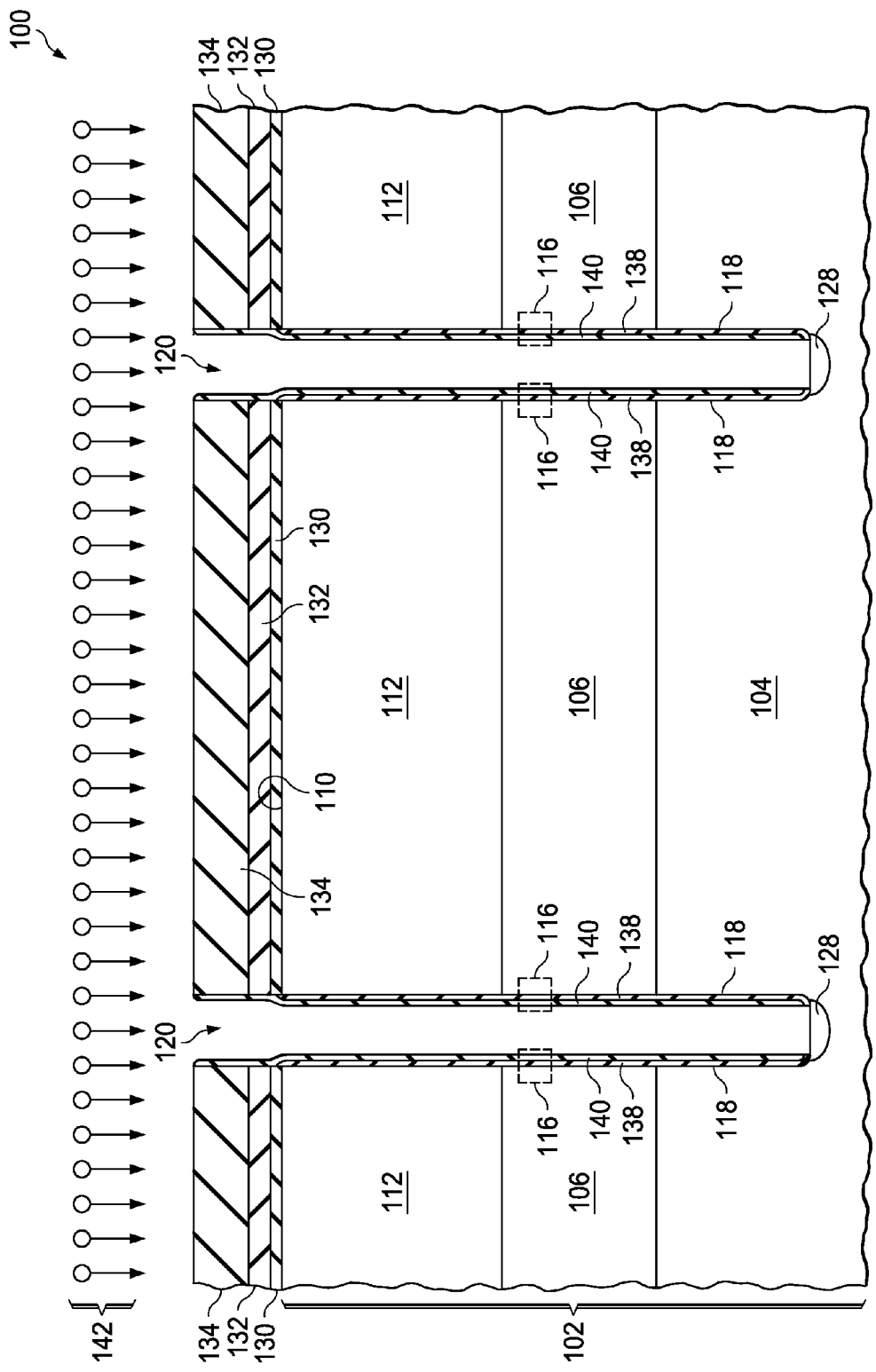

Referring to FIG. 2E, p-type dopants 142 are implanted into the exposed semiconductor material 104 at the bottoms of the deep trenches 120 to form the contact regions 128. The dopants 142 are selected so that the contact regions 128 are the same conductivity type as the semiconductor material 104. In the instant example, the semiconductor material 104 is p-type, and the dopants 142 include boron. The dopants 142 may be implanted at a dose of, for example, $2 \times 10^{14}$ cm$^{-2}$ to $2 \times 10^{15}$ cm$^{-2}$ at a tilt angle of substantially zero degrees.

Figure 2F:
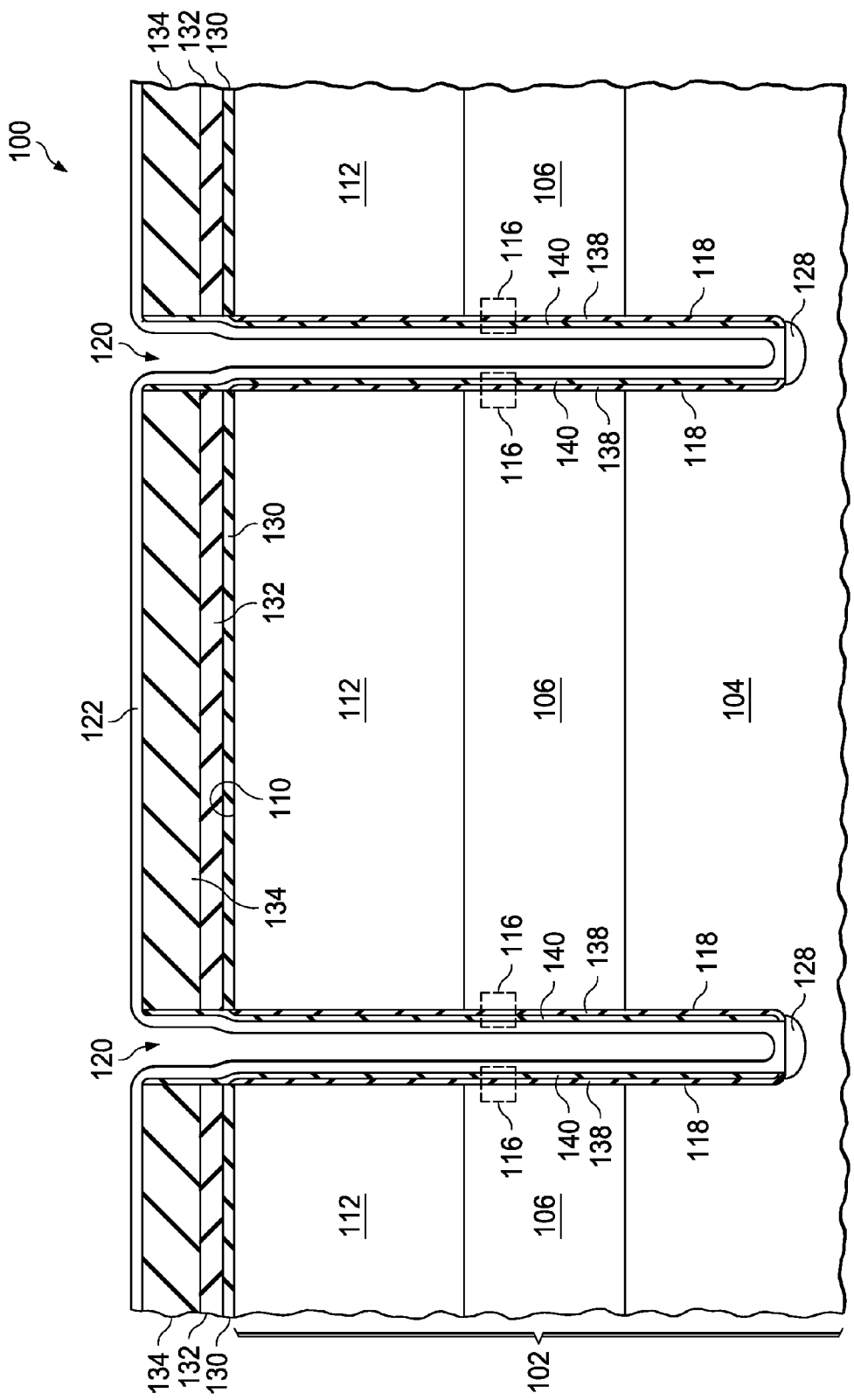

Referring to FIG. 2F, the first layer of polysilicon 122 is formed on the existing semiconductor device 100, extending into the deep trenches 120 and making electrical contacts to the contact regions 128. The first layer of polysilicon 122 may have a thickness of 150 nanometers to 200 nanometers, so as not to fill the deep trenches 120. The first layer of polysilicon 122 may be formed, for example, at a temperature of about 620° C. by providing 500 standard cubic centimeters per minute (sccm) to 600 sccm of silane gas (SiH$_4$) at a pressure of about 200 millitorr. The first layer of polysilicon 122 is substantially undoped as formed, which advantageously reduces doping contamination of a backside of the substrate 102 compared to processes using doped polysilicon.

Figure 2G:
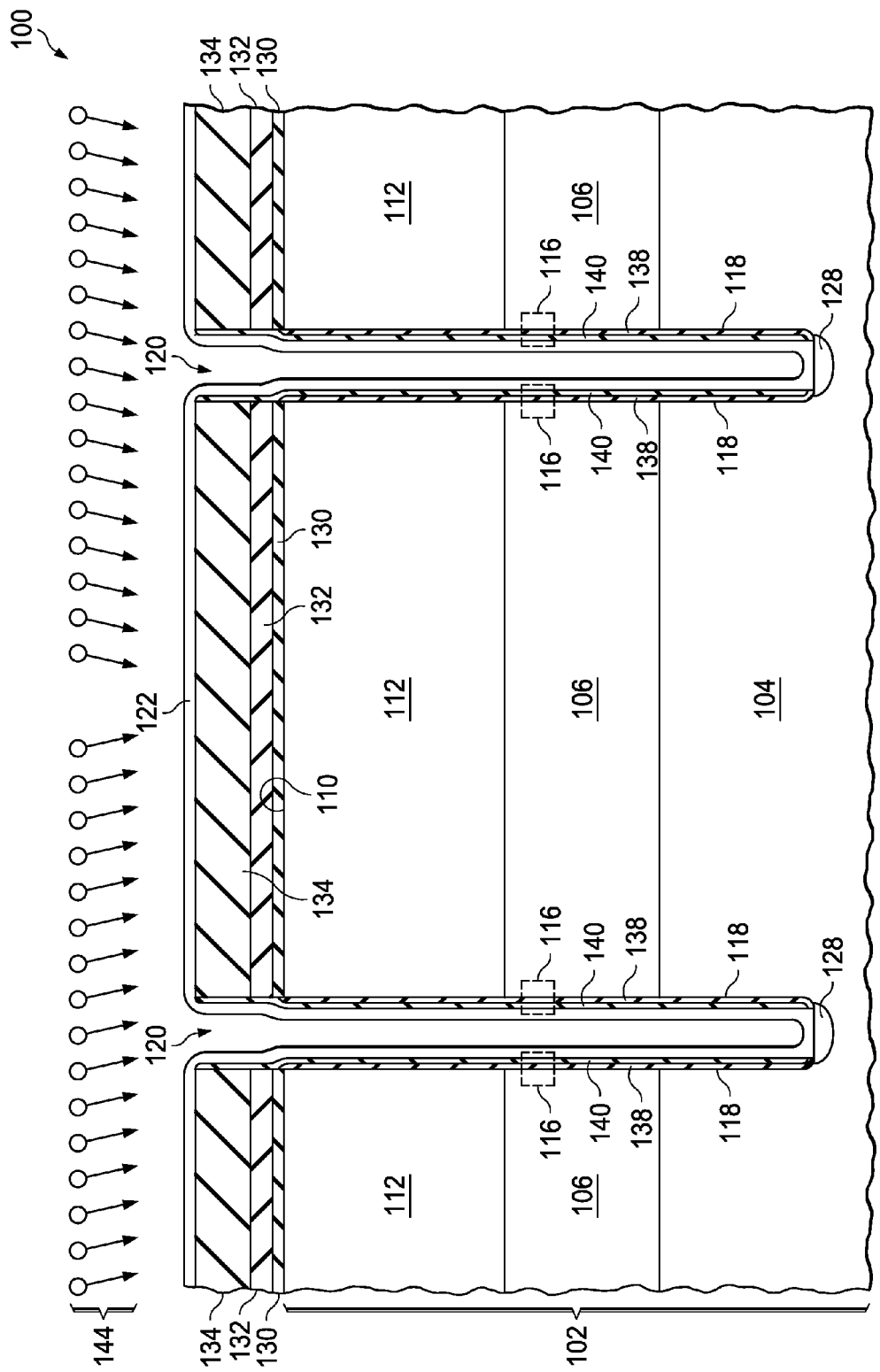

Referring to FIG. 2G, p-type dopants 144 are implanted into the first layer of polysilicon 122 at a dose of, for example, $1 \times 10^{15}$ cm$^{-2}$ to $1 \times 10^{16}$ cm$^{-2}$ in 4 sub-doses at tilt angles of about zero degrees and twist angles of about 45 degrees. Alternatively, the p-type dopants 144 may implanted in 4 sub-doses at tilt angles of about 1 degree to 2 degrees and twist angles of about zero degrees. The p-type dopants 144 may include boron, which advantageously has a higher diffusion coefficient than other common p-type dopants such as gallium and indium. The total dose of the p-type dopants 144 may be selected based on depths and widths of the deep trenches 120 to provide desired sheet resistance values in the first layer of polysilicon 122 and subsequently-formed second layer of polysilicon 124.

Figure 2H:
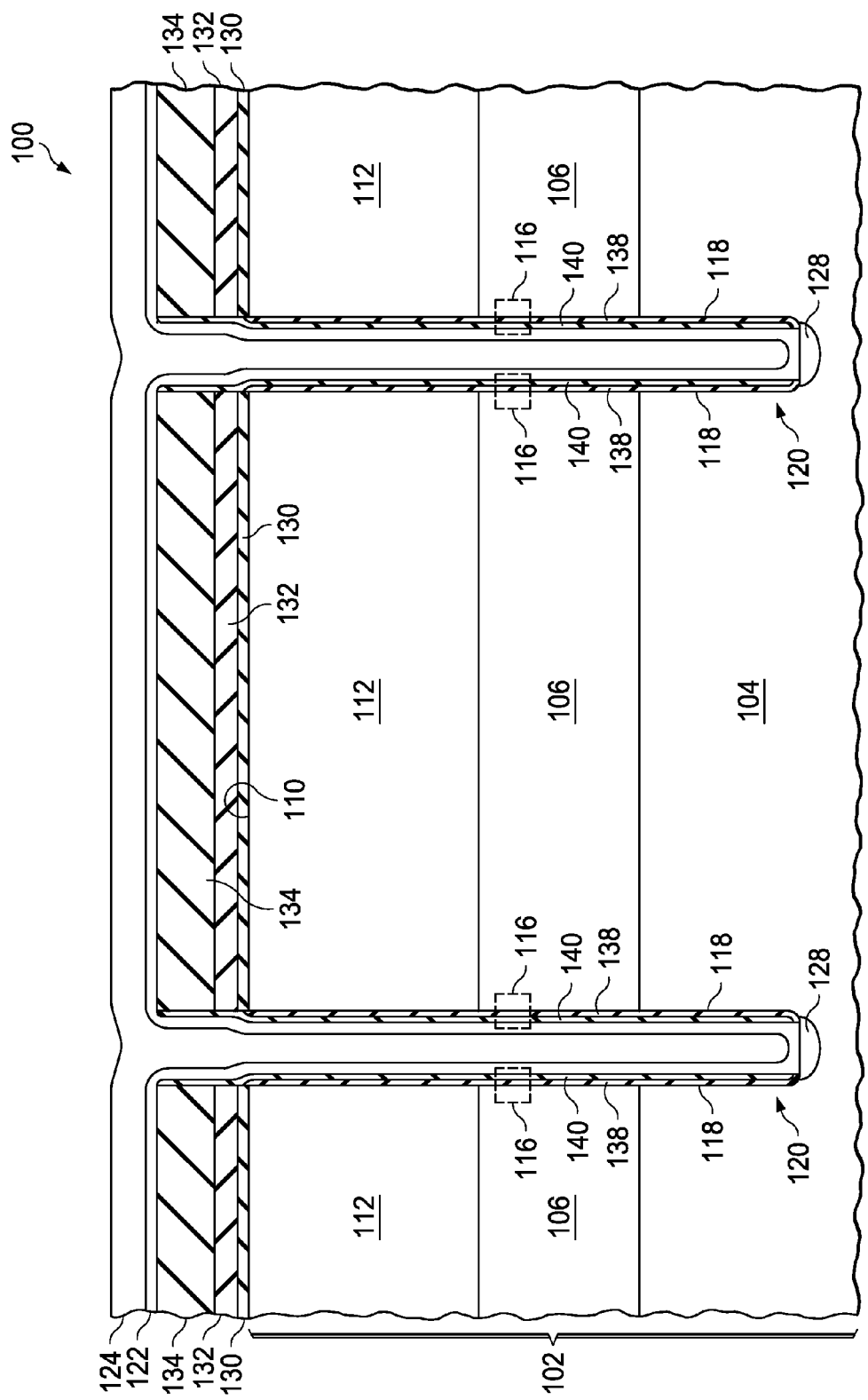

Referring to FIG. 2H, the second layer of polysilicon 124 is formed on the first layer of polysilicon 122, extending into the deep trenches 120. The second layer of polysilicon 124 may have a thickness of 800 nanometers to 1.5 microns, and may substantially fill the deep trenches 120. The second layer of polysilicon 124 may be formed using similar process conditions as described for the first layer of polysilicon 122 in reference to FIG. 2F. The second layer of polysilicon 124 is substantially undoped as formed, which also advantageously reduces doping contamination of a backside of the substrate 102 compared to processes using doped silicon layers.

Figure 2I:
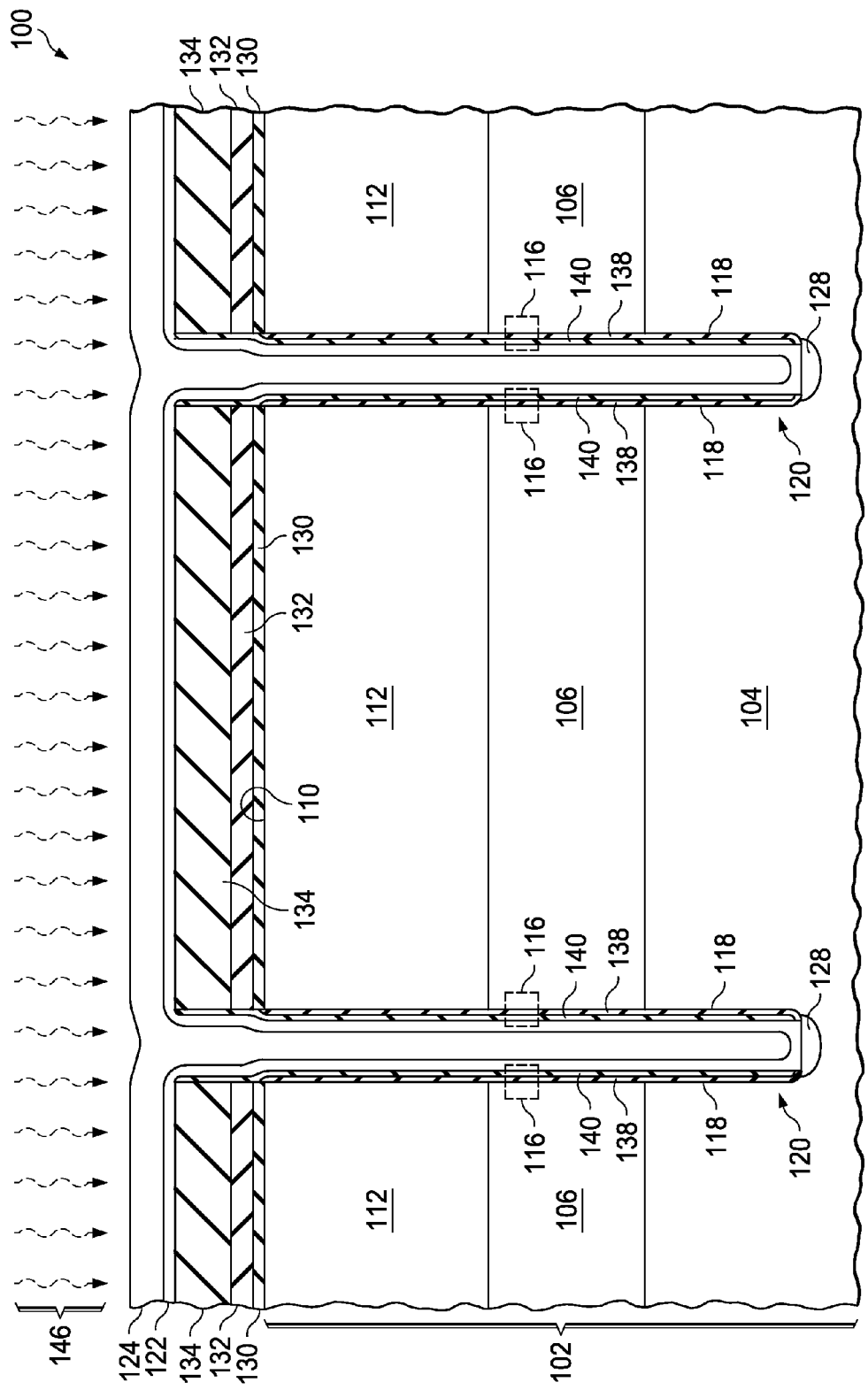

Referring to FIG. 2I, a thermal drive anneal 146 heats the substrate 102 so as to activate the implanted dopants 144 of FIG. 2G, and to diffuse the implanted dopants 144 throughout the first layer of polysilicon 122 and the second layer of polysilicon 124. The thermal drive anneal may be a furnace anneal at 1000° C. to 1100° C. for 100 minutes to 150 minutes in a nitrogen ambient. The thermal drive anneal advantageously provides a desired uniformity of the implanted dopants 144 in the first layer of polysilicon 122 and the second layer of polysilicon 124.

Figure 2J:
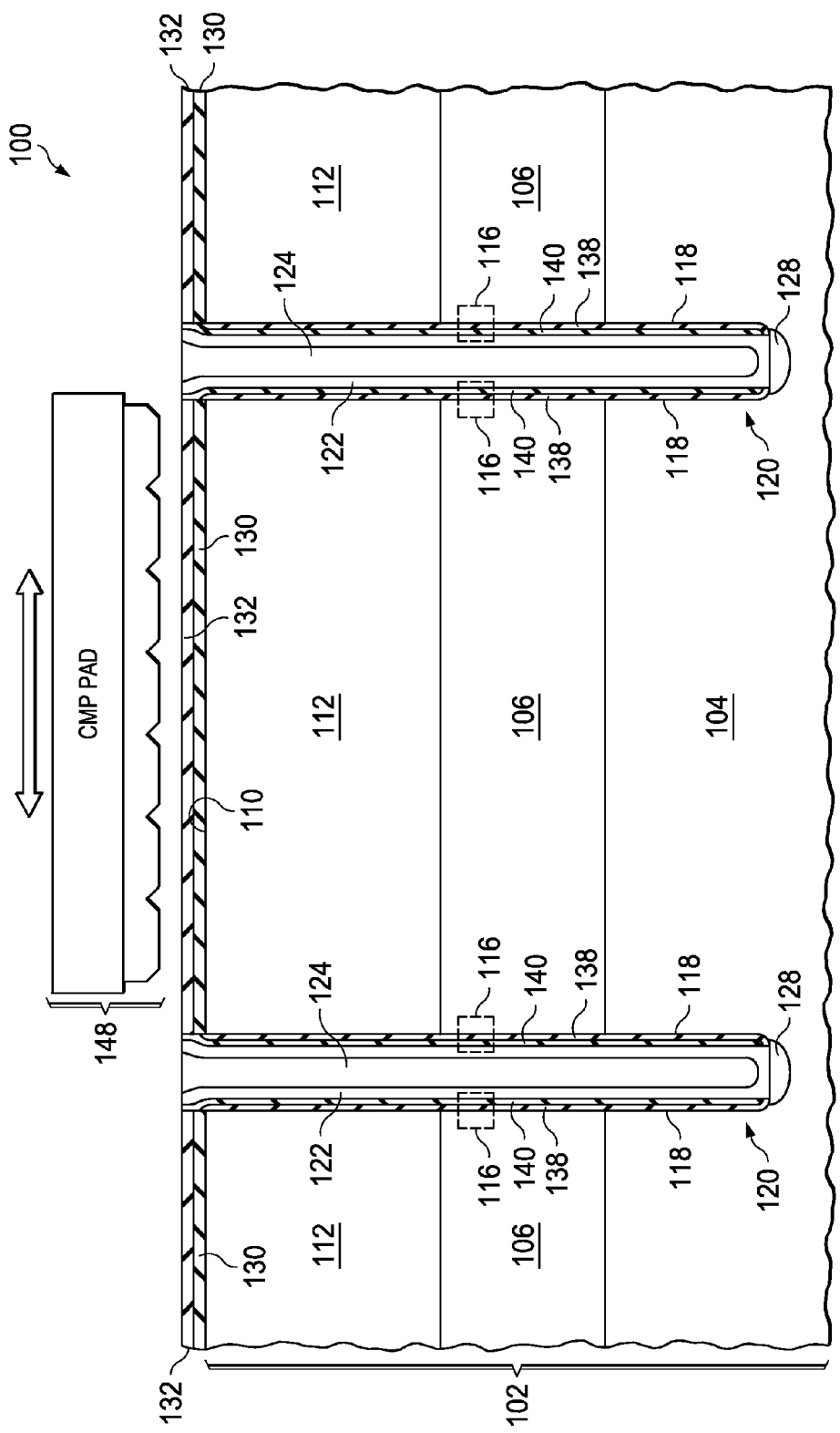

Referring to FIG. 2J, the second layer of polysilicon 124, the first layer of polysilicon 122, the layer of hard mask oxide 134 of FIG. 2I, and a portion of the layer of pad nitride 132 are removed using a chemical mechanical polish (CMP) process 148 depicted in FIG. 2J as a CMP pad 148. The remaining layer of pad nitride 132, and the layer of pad oxide 130 are subsequently removed to provide the structure of FIG. 1. Alternatively, the layer of pad oxide 130 may be left in place during subsequent implants and anneals, and removed later in the fabrication process.

In an alternate version of the instant example, an analogous semiconductor device with n-type semiconductor material in the substrate may be formed by implanting n-type dopants such as phosphorus into the first layer of polysilicon. The resulting deep trench structure provides an electrical connection from a top surface of the semiconductor device to the n-type semiconductor material in the substrate.

Figure 3:
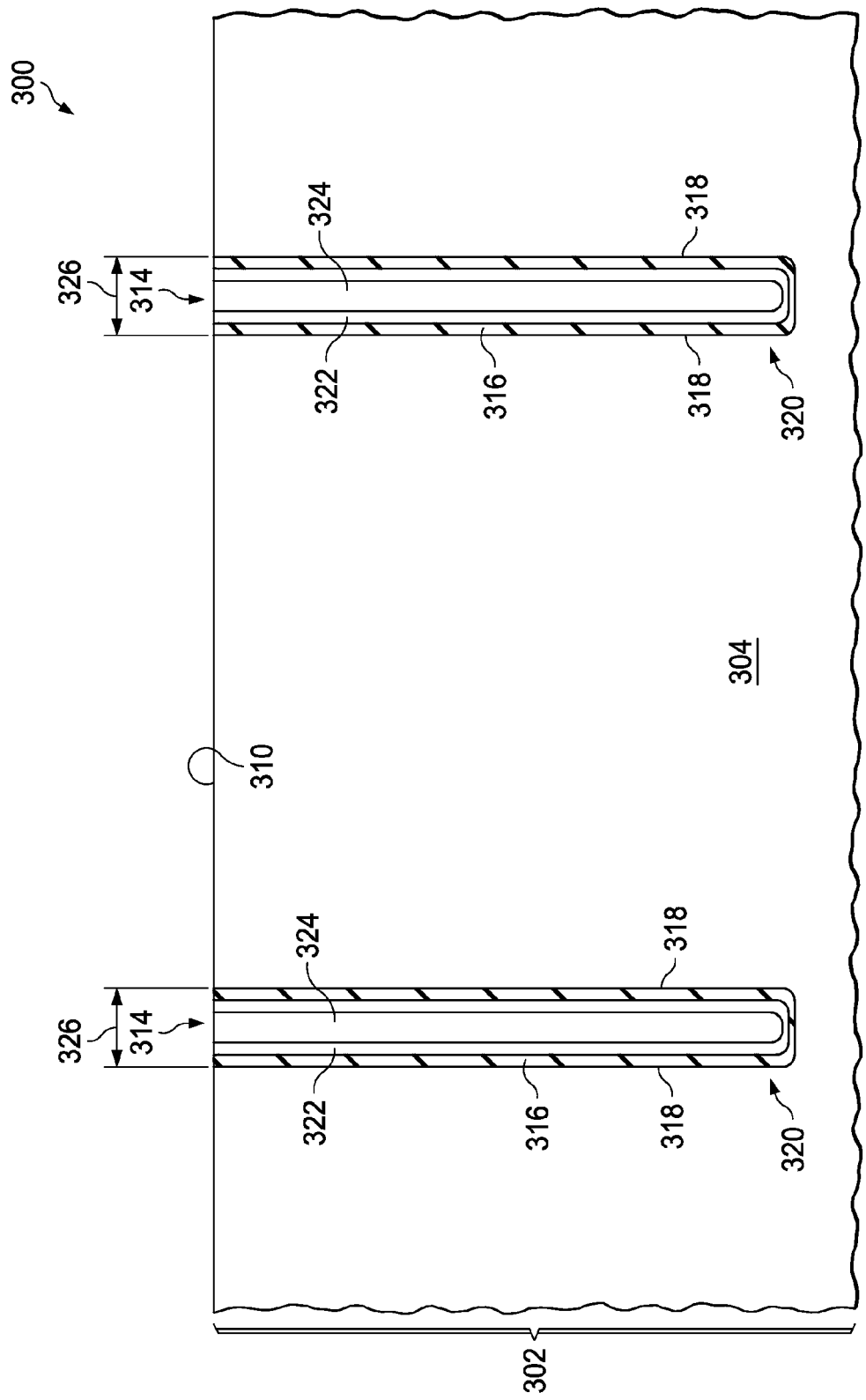
FIG. 3 is a cross section of another example semiconductor device.

FIG. 3 is a cross section of another example semiconductor device. The semiconductor device 300 is formed in a substrate 302 comprising semiconductor material 304, for example, silicon. The semiconductor device 300 includes one or more deep trench structures 314 which extend at least 10 microns below a top surface 310 of the substrate 302. Each deep trench structure 314 includes a dielectric liner 316 on sidewalls 318 and a bottom of a deep trench 320 of the deep trench structure 314. A first layer of polysilicon 322 is disposed on the dielectric liner 316, extending to a bottom of the deep trench structure 314. A second layer of polysilicon 324 is disposed on the first layer of polysilicon 322. Dopants are distributed in the first layer of polysilicon 322 and the second layer of polysilicon 324 with an average doping density of at least $1 \times 10^{18}$ cm$^{-3}$. A width 326 of the deep trench structure 314 is 1.5 microns to 3.5 microns.

In the instant example, the dielectric liner 316 isolates the first layer of polysilicon 322 from the substrate 302. The deep trench structures 314 may provide resistors or capacitors which advantageously do not take much surface space of the semiconductor device 300, enabling a reduced size and hence lower fabrication costs.

Figure 4A:
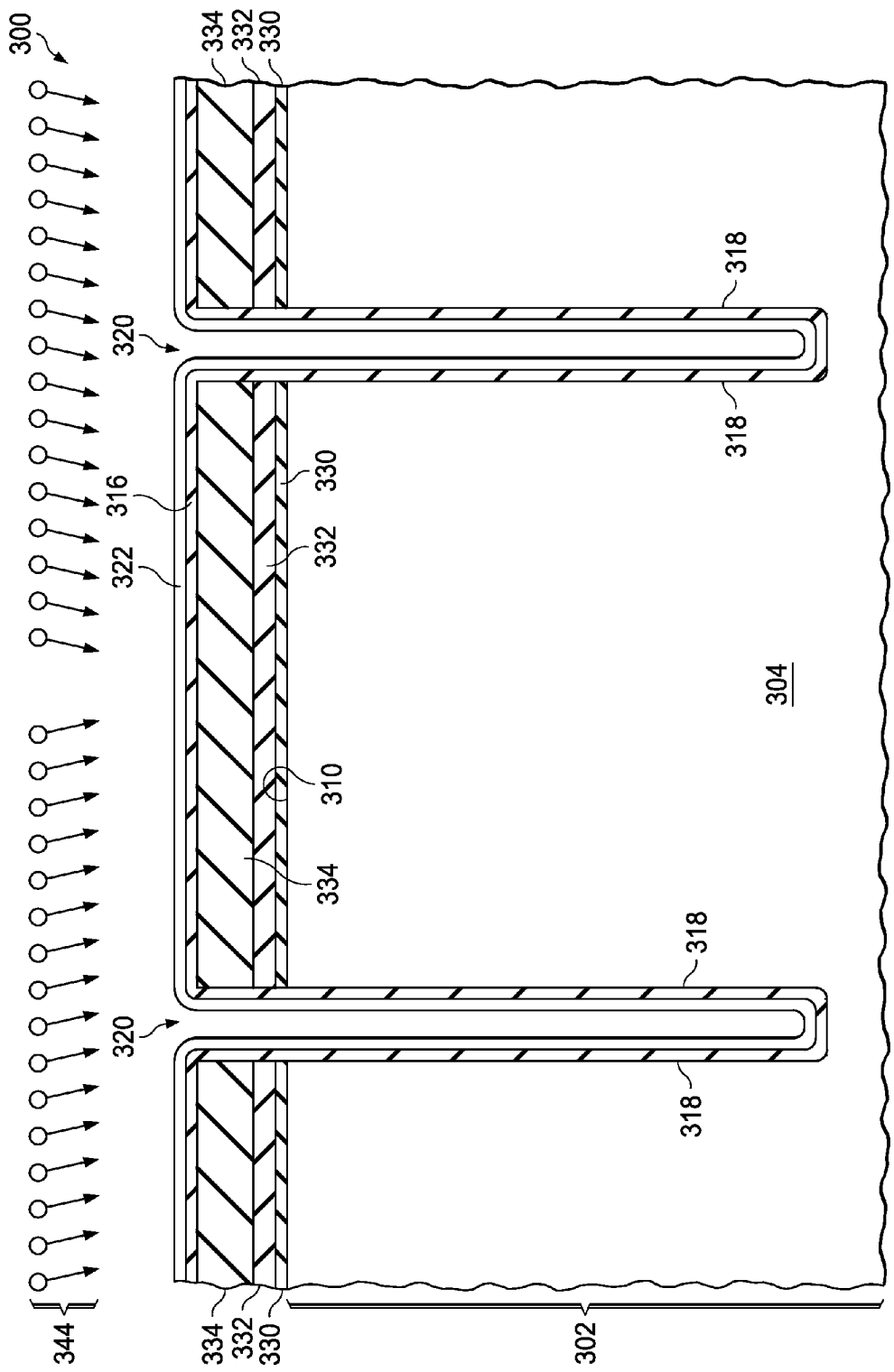
FIG. 4A and FIG. 4B are cross sections of the semiconductor device of FIG. 3, depicted in successive stages of fabrication.
Figure 4B:
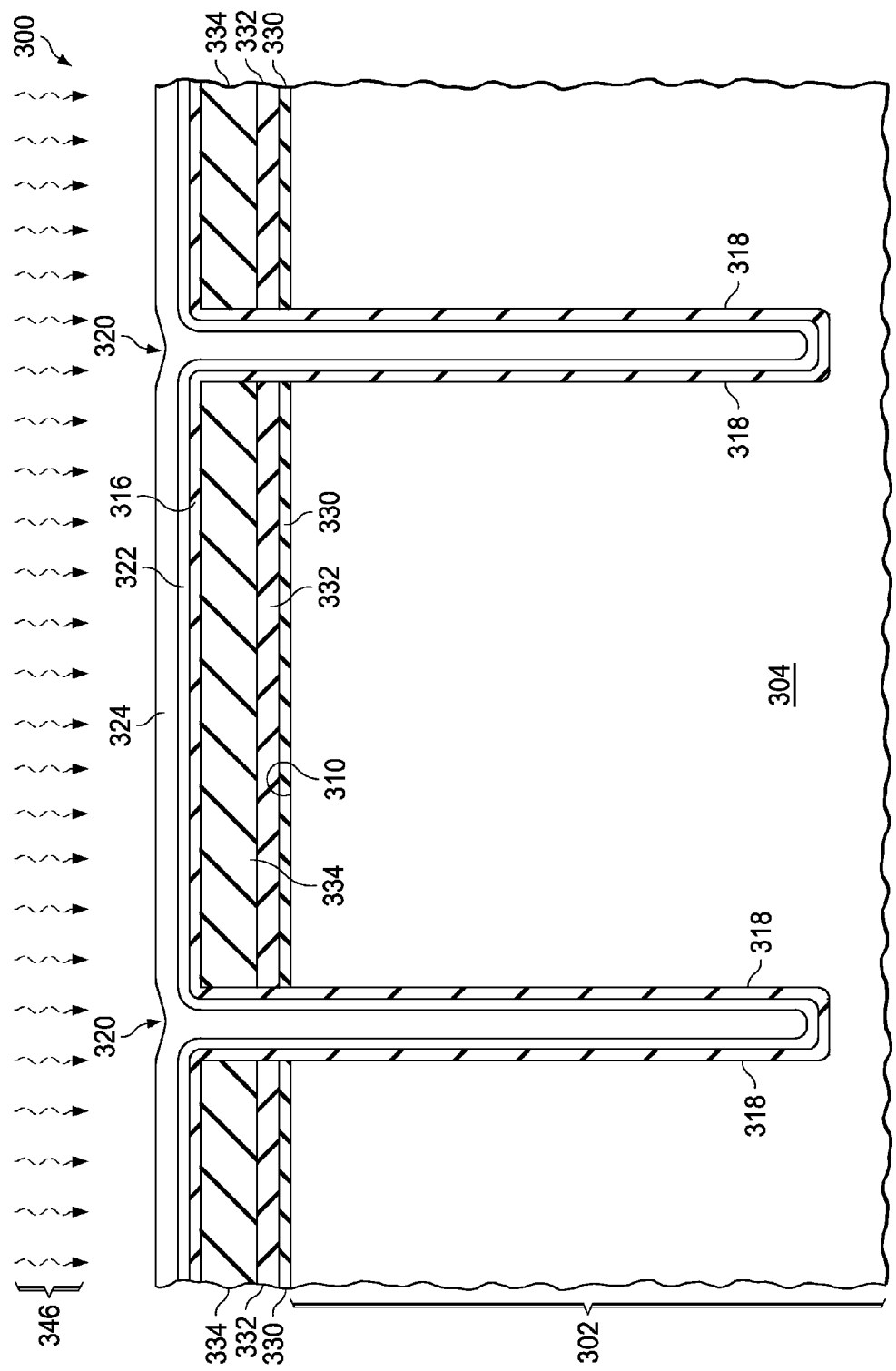

FIG. 4A and FIG. 4B are cross sections of the semiconductor device of FIG. 3, depicted in successive stages of fabrication. Referring to FIG. 4A, a layer of pad oxide 330 is formed at the top surface 310 of the substrate. A layer of pad nitride 332 is formed on the layer of pad oxide 330. A layer of hard mask oxide 334 is formed over the layer of pad nitride 332. The layer of hard mask oxide 334, the layer of pad nitride 332 and the layer of pad oxide 330 may be formed as described in reference to FIG. 2A. Deep trenches 320 are formed through the layer of hard mask oxide 334, the layer of pad nitride 332 and the layer of pad oxide 330, and into the substrate 302 at least 10 microns. The deep trenches 320 may be, for example, 12 microns to 35 microns deep. The deep trenches 320 may be formed as described in reference to FIG. 2B. The dielectric liner 316 is formed over the layer of hard mask oxide 334 and extending onto the sidewalls 318 of the deep trenches 320. The dielectric liner may include a layer of thermal oxide and a layer of deposited oxide, as described in reference to FIG. 2C, or may be formed by other methods. The first layer of polysilicon 322 is formed on the dielectric liner 316, extending into, but not filling, the deep trenches 320. The first layer of polysilicon 322 may have a thickness of 150 nanometers to 200 nanometers. The first layer of polysilicon 322 is substantially undoped, accruing the advantage discussed in reference to FIG. 2F, and may be formed as described in reference to FIG. 2F. Dopants 344 are implanted into the first layer of polysilicon 322 at a dose of, for example, $2 \times 10^{15}$ cm$^{-2}$ to $1 \times 10^{16}$ cm$^{-2}$ in 4 sub-doses at tilt angles of 1 degree to 2 degrees and twist angles of about zero degrees. The dopants 344 may be p-type dopants and include boron, or may be n-type dopants and include phosphorus and/or possibly arsenic. The total dose of the dopants 344 may be selected based on depths and widths of the deep trenches 320 to provide desired sheet resistance values in the first layer of polysilicon 322 and subsequently-formed second layer of polysilicon 324.

Referring to FIG. 4B, the second layer of polysilicon 324 is formed on the first layer of polysilicon 322, extending into the deep trenches 320. The second layer of polysilicon 324 may have a thickness of 800 nanometers to 1.5 microns, and may substantially fill the deep trenches 320. The second layer of polysilicon 324 may be formed using similar process conditions as described in reference to FIG. 2F. The second layer of polysilicon 324 is substantially undoped as formed, accruing the advantage discussed in reference to FIG. 2H. A thermal drive anneal 346 heats the substrate 302 so as to activate the implanted dopants 344 of FIG. 4A, and to diffuse the implanted dopants 344 throughout the first layer of polysilicon 322 and the second layer of polysilicon 324. The thermal drive anneal may be similar to that discussed in reference to FIG. 2I, and advantageously provides a desired uniformity of the implanted dopants 344 in the first layer of polysilicon 322 and the second layer of polysilicon 324. Formation of the first layer of polysilicon 322 and the second layer of polysilicon 324 as undoped layers accrues the advantage discussed in reference to FIG. 2I. The second layer of polysilicon 324, the first layer of polysilicon 322, the layer of hard mask oxide 334, and a portion of the layer of pad nitride 332 are removed using a CMP process. The remaining layer of pad nitride 332, and the layer of pad oxide 330 are subsequently removed to provide the structure of FIG. 3.

Figure 5:
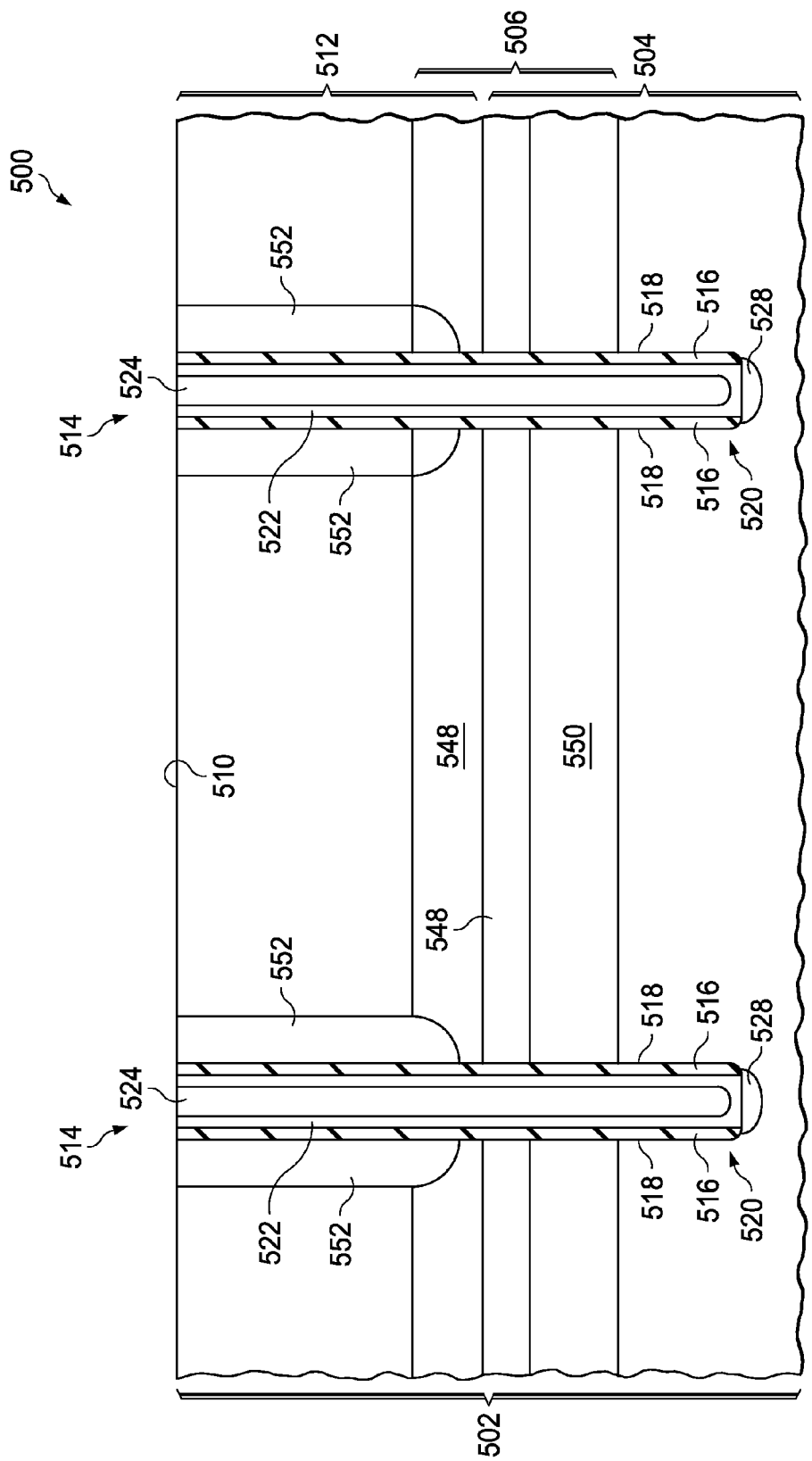
FIG. 5 is a cross section of an alternate semiconductor device containing a buried layer and deep trench structures with a self-aligned sinker to the buried layer.

FIG. 5 is a cross section of an alternate semiconductor device containing a buried layer and deep trench structures with a self-aligned sinker to the buried layer. The semiconductor device 500 is formed in a substrate 502 comprising a p-type base semiconductor layer 504 of semiconductor material, an n-type buried layer 506 of semiconductor material and a p-type upper semiconductor layer 512 extending to a top surface 510 of the substrate 502. The p-type base semiconductor layer 504 may be an epitaxial semiconductor layer with a resistivity of 5 ohm-cm to 10 ohm-cm. The p-type upper semiconductor layer 512 may also be an epitaxial semiconductor layer with a resistivity of 5 ohm-cm to 10 ohm-cm. The n-type buried layer 506 may include a main layer 548 which straddles the boundary between the base semiconductor layer 504 and the upper semiconductor layer 512, extending at least a micron into the base semiconductor layer 504 and at least a micron into the upper semiconductor layer 512. The n-type buried layer 506 may also include a lightly-doped layer 550 extending at least 2 microns below the main layer 548, disposed in the base semiconductor layer 504. The n-type buried layer 506 may be formed as described in the commonly assigned patent application having patent application Ser. No. 14/555,330, filed concurrently with this application, and which is incorporated herein by reference.

The semiconductor device 500 includes one or more deep trench structures 514 which extend at least 10 microns deep in the substrate 502. Each deep trench structure 514 includes a dielectric liner 516 on sidewalls 518 of a deep trench 520 of the deep trench structure 514. A first layer of polysilicon 522 is disposed on the dielectric liner 516, extending to a bottom of the deep trench structure 514. A second layer of polysilicon 524 is disposed on the first layer of polysilicon 522, and extends into the deep trench 520. Dopants are distributed in the first layer of polysilicon 522 and the second layer of polysilicon 524 with an average doping density of at least $1 \times 10^{18}$ cm$^{-3}$. The trench structures 514 may be formed as described in any of the example herein.

In the instant example, dielectric material of the dielectric liners 516 is removed at bottoms of the deep trench structures 514 and contact regions 528 are disposed in the substrate 502 at the bottoms of the deep trench structures 514 so that the first layer of polysilicon 522 makes electrical connections to the substrate 502 through the contact regions 528. The contact regions 528 and the method of removing the dielectric liners 516 at the bottom of each deep trench structure 514 may be done as described in the commonly assigned patent application having patent application Ser. No. 14/555,359, filed concurrently with this application, and which is incorporated herein by reference.

N-type self-aligned sinkers 552 are disposed in the upper semiconductor layer 512 abutting the deep trench structures 514 and extending to the buried layer 506. The self-aligned sinkers 552 provide electrical connections to the buried layer 506. The self-aligned sinkers 552 may be formed as described in the commonly assigned patent application having patent application Ser. No. 14/555,209, filed concurrently with this application, and which is incorporated herein by reference.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a semiconductor device, comprising the steps:
   providing a substrate comprising a semiconductor material;
   forming a deep trench at least 10 microns deep in the substrate, the deep trench being 1.5 microns to 3.5 microns wide;
   forming a dielectric liner on sidewalls of the deep trench;
   forming a first layer of polysilicon on the dielectric liner so that the first layer of polysilicon extends into the deep trench, the first layer of polysilicon being formed as an undoped layer;
   implanting dopants into the first layer of polysilicon;
   forming a second layer of polysilicon on the first layer of polysilicon so that the second layer of polysilicon extends into the deep trench, the second layer of polysilicon being formed as an undoped layer; and
   annealing the substrate so as to activate and diffuse the implanted dopants, so that an average doping density in the first layer of polysilicon and the second layer of polysilicon is at least $1 \times 10^{18}$ cm$^{-3}$.

2. The method of claim 1, wherein the dopants are implanted at a dose of $2 \times 10^{15}$ cm$^2$ to $1 \times 10^{16}$ cm$^2$.

3. The method of claim 1, wherein the dopants are implanted in 4 sub-doses at tilt angles of 1 degree to 2 degrees and twist angles of about zero degrees.

4. The method of claim 1, wherein the first layer of polysilicon has a thickness of 150 nanometers to 200 nanometers.

5. The method of claim 1, wherein the step of annealing the substrate includes a furnace anneal at 1000° C. to 1100° C. for 100 minutes to 150 minutes in a nitrogen ambient.

6. The method of claim 1, comprising forming a buried layer in the substrate prior to forming the deep trench, so that the deep trench extends below a bottom surface of the buried layer.

7. The method of claim 1, wherein forming the dielectric liner includes forming a layer of thermal oxide on the sidewalls and forming a layer of deposited silicon dioxide on the layer of thermal oxide.

8. The method of claim 1, comprising removing the dielectric liner at a bottom of the deep trench prior to forming the first layer of polysilicon, and forming the first layer of polysilicon to extend to a bottom of the deep trench so that the first layer of polysilicon makes an electrical contact to the substrate at the bottom of the deep trench.

9. The method of claim 8, comprising implanting dopants into the semiconductor material of the substrate at the bottom of the deep trench, after removing the dielectric liner at a bottom of the deep trench and prior to forming the first layer of polysilicon.

10. The method of claim 1, wherein the first layer of polysilicon is formed extending to a bottom of the deep trench so that the dielectric liner isolates the first layer of polysilicon from the substrate.

11. A method of forming a semiconductor device, comprising the steps:
    providing a substrate comprising a semiconductor material;
    forming a deep trench at least 10 microns deep in the substrate, the deep trench being 1.5 microns to 3.5 microns wide;
    forming a dielectric liner on sidewalls of the deep trench;
    removing the dielectric liner at a bottom of the deep trench;
    implanting dopants into the semiconductor material of the substrate at the bottom of the deep trench;
    forming a first layer of polysilicon on the dielectric liner, extending to a bottom of the deep trench so that the first layer of polysilicon makes an electrical contact to the substrate at the bottom of the deep trench, the first layer of polysilicon being formed as an undoped layer;
    implanting dopants into the first layer of polysilicon;
    forming a second layer of polysilicon on the first layer of polysilicon so that the second layer of polysilicon extends into the deep trench, the second layer of polysilicon being formed as an undoped layer; and
    annealing the substrate so as to activate and diffuse the implanted dopants, so that an average doping density in the first layer of polysilicon and the second layer of polysilicon is at least $1 \times 10^{18}$ cm$^{-3}$.

12. The method of claim 11, wherein forming the dielectric liner includes forming a layer of thermal oxide on the sidewalls and forming a layer of deposited silicon dioxide on the layer of thermal oxide.

13. The method of claim 11, comprising forming a buried layer in the substrate prior to forming the deep trench, so that the deep trench extends below a bottom surface of the buried layer.

\* \* \* \* \*